United States Patent
Hsu et al.

(10) Patent No.: US 7,516,374 B2
(45) Date of Patent: Apr. 7, 2009

(54) TESTING CIRCUIT AND RELATED METHOD OF INJECTING A TIME JITTER

(75) Inventors: Jimmy Hsu, Taipei Hsien (TW); Min-Sheng Lin, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 353 days.

(21) Appl. No.: 11/425,393

(22) Filed: Jun. 21, 2006

(65) Prior Publication Data

US 2007/0061658 A1 Mar. 15, 2007

(30) Foreign Application Priority Data

Aug. 29, 2005 (TW) .............. 94129510 A

(51) Int. Cl.
*G06F 11/00* (2006.01)

(52) U.S. Cl. ............ 714/705; 714/704; 714/25; 714/32; 714/700; 714/712; 714/707; 714/716; 714/738; 714/741; 714/744; 714/717; 714/724; 714/731; 714/742; 714/745; 702/69

(58) Field of Classification Search ............ None
See application file for complete search history.

(56) References Cited

U.S. PATENT DOCUMENTS

| | | | | |
|---|---|---|---|---|
| 5,499,235 | A | * | 3/1996 | Houdoin et al. .......... 370/395.1 |
| 5,835,501 | A | * | 11/1998 | Dalmia et al. .............. 714/704 |
| 6,285,197 | B2 | * | 9/2001 | Walker ...................... 324/603 |
| 7,171,601 | B2 | * | 1/2007 | Frisch ........................ 714/738 |
| 7,236,116 | B2 | * | 6/2007 | Hong ......................... 341/150 |
| 7,287,200 | B2 | * | 10/2007 | Miyaji ........................ 714/700 |
| 7,394,277 | B2 | * | 7/2008 | Ishida et al. ................ 324/765 |
| 2003/0041294 | A1 | * | 2/2003 | Moll et al. .................. 714/709 |

* cited by examiner

*Primary Examiner*—John P Trimmings
(74) *Attorney, Agent, or Firm*—Winston Hsu

(57) ABSTRACT

A testing method includes selecting a low-pass filter by simulation, generating testing signals with the low-pass filter receiving output signals of an under-test circuit, and outputting the testing signals to an input of the under-test circuit for predetermined measurements. A testing circuit and testing method achieve the same jitter injection as conventional high-speed testing instruments, but save testing cost.

20 Claims, 5 Drawing Sheets

TESTING CIRCUIT AND RELATED METHOD OF INJECTING A TIME JITTER

BACKGROUND OF THE INVENTION

1. Field of the Invention

The present invention provides a testing circuit and a related testing method, and more particularly, to a testing circuit for injecting a time jitter for testing a capability to receive signals and a related testing method.

2. Description of the Prior Art

All electronic devices must be tested during fabrication. A test for testing the capability to receive signals is performed on electronic devices to determine whether the received signals are precisely acknowledged. An under-test electronic device of the prior art comprises a core circuit and a testing circuit. An output signal generated by the core circuit is transmitted to a testing instrument through an output of the core circuit. The testing instrument receives and processes the output signal of the core circuit for generating a testing signal. The testing signal is transmitted to an input of the core circuit. The capability to receive signals of the under-test electronic device is confirmed by confirming whether the output signal outputted from the output of the core circuit matches the testing signal received at the input of the core circuit.

Please refer to FIG. 1. FIG. 1 is a diagram of a high-speed testing instrument 120 of the prior art testing an under-test electronic device 110. The under-test electronic device 110 comprises an output 112 and an input 114. The output 112 is coupled to an input 124 of the high-speed testing instrument 120. The input 114 is coupled to an output 122 of the high-speed testing instrument 120. A processing circuit 126 of the high-speed testing instrument 120 is utilized for processing the signals received at the input 124. The high-speed testing instrument 120 generates a testing signal according to requirements and outputs the testing signal at the output 122 to the input 114 of the under-test electronic device 110 for testing the capability to receive signals.

Along with the growth of processing speed of electronic devices, the requirement for high-speed testing is also growing. "High-speed" means that the processing speed of the processing circuit 126 is faster or equal to the processing speed of the under-test electronic device 110. The built-in processing circuit 126, which is capable of processing signals efficiently, of the high-speed testing instrument 120 dynamically analyzes the electrical properties of the output signals of the under-test electronic device 110 and generates a testing signal to the input 114 of the under-test electronic device 110 according to various testing conditions. However, the fabricating cost required for the high-speed testing instrument 120 make is unaffordable. Besides, although additional high-speed testing equipment can be used as a testing instrument to help complete a test by injecting a time jitter, the fabricating cost of the additional high-speed testing equipment is also unaffordable.

SUMMARY OF THE INVENTION

The present invention provides a testing circuit of injecting time jitter for an under-test circuit. The testing circuit comprises an input for receiving an output signal of the under-test circuit from an output of the under-test circuit, an output for outputting a testing signal of the testing circuit to an input of the under-test circuit, and a low-pass filter coupled between the input and the output for generating the testing signal, wherein the testing signal has a time jitter.

The present invention also provides a testing method of injecting a time jitter for an under-test circuit. The testing method comprises simulating a frequency response and a time domain response of a testing circuit wherein the testing circuit is used for generating the testing signal, choosing the testing circuit coupled to the under-test circuit wherein the frequency response and the time domain response of the simulation of the testing circuit approaches a design specification of the under-test circuit, receiving an output signal of the under-test circuit, generating a testing signal having a time jitter, and outputting the testing signal to an input of the under-test circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
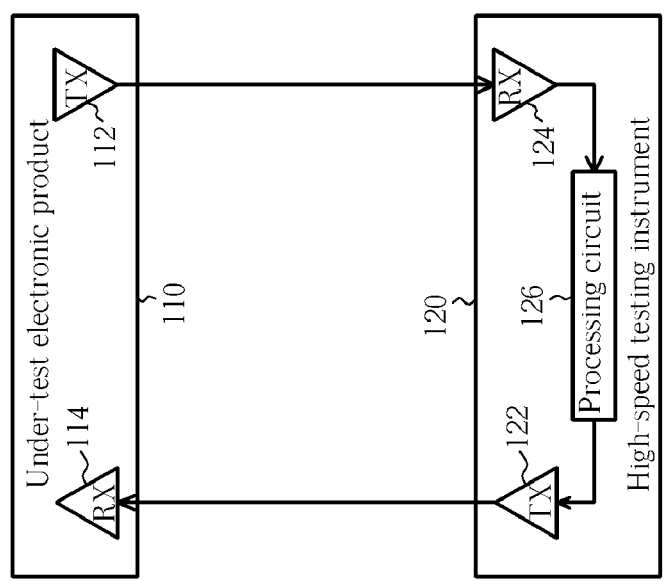
FIG. 1 is a diagram of a high-speed testing instrument testing an under-test electronic device of the prior art.
Figure 2:
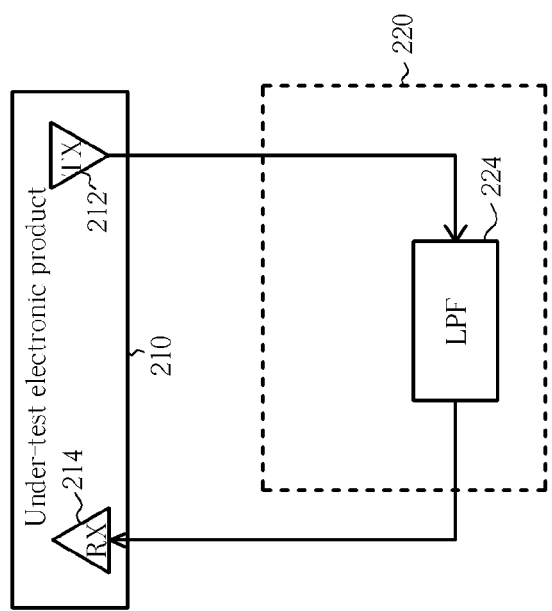
FIG. 2 is a diagram of a first embodiment of a testing circuit testing an under-test electronic device by injecting a time jitter according to the present invention.

Please refer to FIG. 2, which is a diagram of a first embodiment of the testing circuit 220 testing an under-test electronic device 210 by injecting a time jitter. As shown in FIG. 2, an output signal outputted at the output 212 of the under-test electronic device 210 is transmitted to a low-pass filter 224 of the testing circuit 220 of the present invention. The frequency response properties and the time domain response properties of the output signal are changed by the low-pass filter 224. Therefore, the testing circuit 220 of the present invention simulates an insertion loss for the under-testing electronic device 210, adjusts an available bandwidth, and modulates a gain of a data-dependent time jitter. By adjusting the low-pass filter 224, the frequency response and the time domain response are close to the specifications of the under-test electronic device 210. For example, the insertion loss of the testing circuit 220 can be adjusted to be close to a maximum of the design specifications of the under-test electronic device 210. Properties of the output signal generated from the under-test electronic device 210 are changed by the low-pass filter 224, and the time jitter and the amplitude of the testing signal are thus determined. The testing signal is then transmitted to the input 214 of the under-test electronic device 210 for efficiently performing a sensitivity analysis of the under-test electronic device 210.

In other words, the under-test electronic device 210 is designed to achieve the specifications of the input 214 and the specifications of others devices. The testing circuit 220 is designed for verify the actual performance of the under-test electronic device 210. For example, the testing circuit 220 provides a critical signal to the input 214 to verify the receiving capability of the under-testing electronic device 210. The frequency response and the time domain response of the testing circuit 220 are calculated by simulation. For example, the frequency response of the testing circuit 220 comprises an insertion loss, a return loss, and an available bandwidth, and the time domain response of the testing circuit 220 may be an eye opening, a signal amplitude gain or other characteristic behaviors drifting as time passing through. By properly selecting or adjusting the low-pass filter 224, the frequency response and the time domain response of the testing circuit 220 are close to the criteria of the specifications of the input 214. When the input and the output of the testing circuit 220 are respectively coupled to the output 212 and the input 214 of the under-test electronic device 210, and when the signals at the input 214 and the output 212 are the same, the capability to receive signals of the under-test electronic device 210 is qualified for the specifications of the under-test electronic device 210. It is not necessary for the testing circuit to analyze the output signals of the under-test electronic device or to generate a testing signal. The fabricating cost of the testing circuit 220 is much less than the high-speed processing circuit of the prior art.

Figure 3:
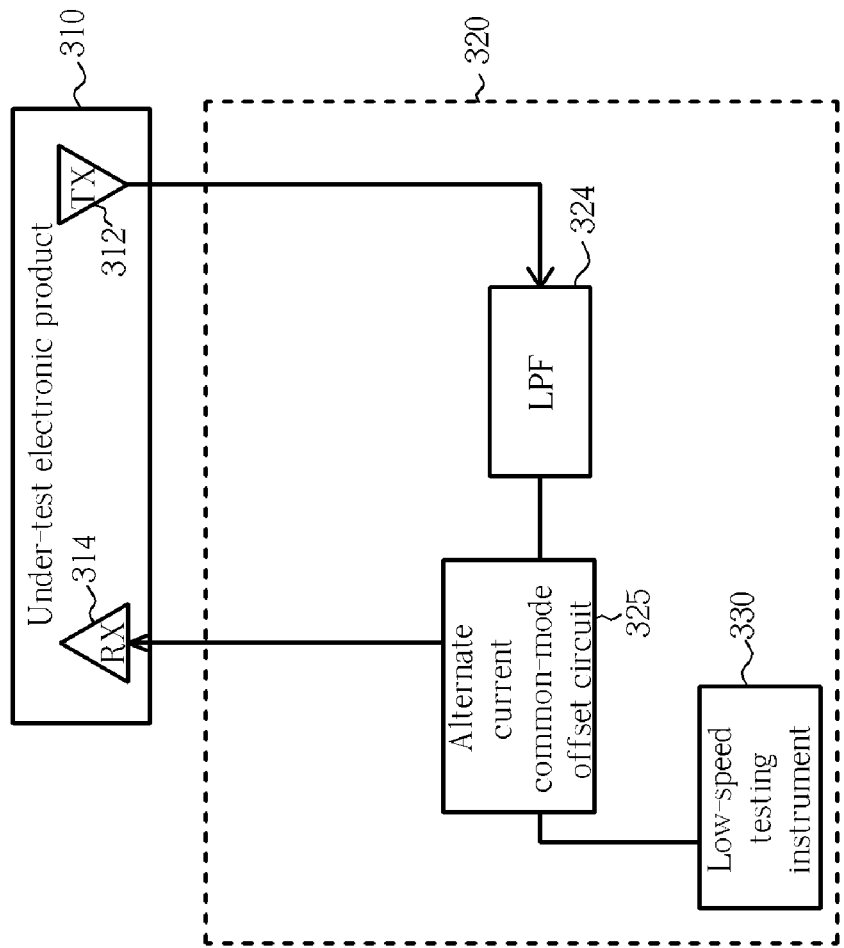
FIG. 3 is diagram of a second embodiment of a testing circuit of the present invention for testing an under-test electronic device.

Please refer to FIG. 3, which is diagram of a second embodiment of a testing circuit 320 of the present invention for testing an under-test electronic device 310. As shown in FIG. 3, the testing circuit 320 of the present invention comprises a low-pass filter 324, an alternate current (AC) common mode offset circuit 325, and a low-speed testing instrument 330. The low-pass filter 324 is utilized to simulate an insertion loss for the under-test electronic device 310, to adjust an available bandwidth, and modulate a gain of a data dependent time jitter. The low-speed testing instrument 330 of the testing circuit 320 of the present invention injects a low-frequency jitter for generating a shift of a DC signal for simulating a periodic jitter. Moreover, the AC common mode voltage is constant. The AC common mode offset circuit 325 receives an output signal generated from the low-speed testing instrument 330, and a period of the output signal of the low-speed testing instrument 330 is longer than the period of the testing signal. The AC common mode offset circuit 325 injects the output signal of the low-speed testing instrument 330 to the testing signal. Therefore, an offset occurs to an AC common mode voltage level of the testing signal. At this time, the AC common mode offset has a period equal to the period of the output signal of the low-speed testing instrument 330.

"Low-speed" represents that the processing speed of the low-speed testing instrument 330 is slower than the under-test electronic device 310. Therefore, the fabricating cost of the low-speed testing instrument 330 is affordable. An inexpensive low-speed testing instrument may also be applied for decreasing the cost. The AC common mode offset circuit of the present invention receives an output signal of the low-speed testing instrument 330 so that the testing signal has a periodic jitter. The period of the periodic jitter equals the period of the output signal of the low-speed testing instrument 330. For example, the output signal of the low-speed testing instrument 330 may be a sinusoidal wave.

The AC common mode offset circuit may be implemented in other manners in the present invention. Please refer to FIG. 4, which is a diagram of a third embodiment of a testing circuit 420 testing the under-test electronic device 310 according to the present invention. The structure of the testing circuit 420 is almost the same with the testing circuit 320 of FIG. 3, however, a low-pass filter 424 and an AC common mode offset circuit 425 are utilized in FIG. 4.

Figure 4:
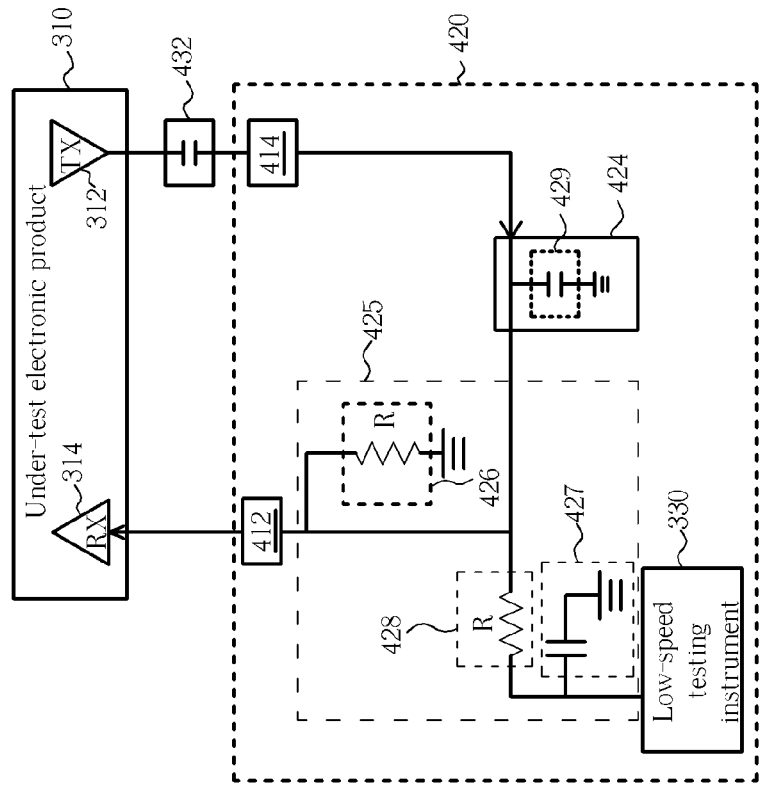
FIG. 4 is a diagram of a third embodiment of a testing circuit testing an under-test electronic device according to the present invention.

As shown in FIG. 4, the testing circuit in FIG. 4 comprises an input 414 and an output 412. The low-pass filter 424 of the embodiment comprises a capacitor 429 having a terminal coupled to the input 414 and another terminal coupled to the ground. The low-pass filter 424 has a frequency response and a time domain response. The frequency response and the time domain response of the low-pass filter are determined by the capacitance of the capacitor.

In the embodiment, the AC common mode offset circuit 425 comprises a capacitor 427 and two resistors 426 and 428. A voltage dividing circuit formed with the resistors 426 and 428 adds a periodic signal of the low-speed testing instrument 330 to the testing signal so that the testing has a periodic jitter. The amplitude of the periodic jitter may be modulated by adjusting the resistances of the resistors 426 and 428. One terminal of the capacitor 427 is coupled to the voltage dividing circuit, and another terminal of the capacitor 427 is coupled to ground so that another low-pass filter is formed. The formed low-pass filter is utilized to prevent high-frequency noise in the periodic signals of the low-speed testing instrument 330 from being added to the testing signal, and a testing error is thus prevented.

In addition, the input 414 of the testing circuit 420 is AC-coupled to the output 312 of the under-test electronic device 310 through a capacitor 432 for preventing different voltage levels from being generated in the AC common mode of the under-test electronic device 310 and the testing circuit 420. Similarly, the output 412 of the testing circuit 420 may also be AC-coupled to the input 314 of the under-test electronic device 310 through the capacitor 432. For those skilled in the art, choices of the low-pass filter and the AC common mode offset circuit are not limited in the present invention. Any low-pass filter that generates a specific frequency response and a specific time domain response for generating a testing signal having a time jitter can also be used in the present invention. Similarly, an AC common mode offset circuit utilized for setting the testing signal to have a periodic jitter can also be used in the present invention.

Figure 5:
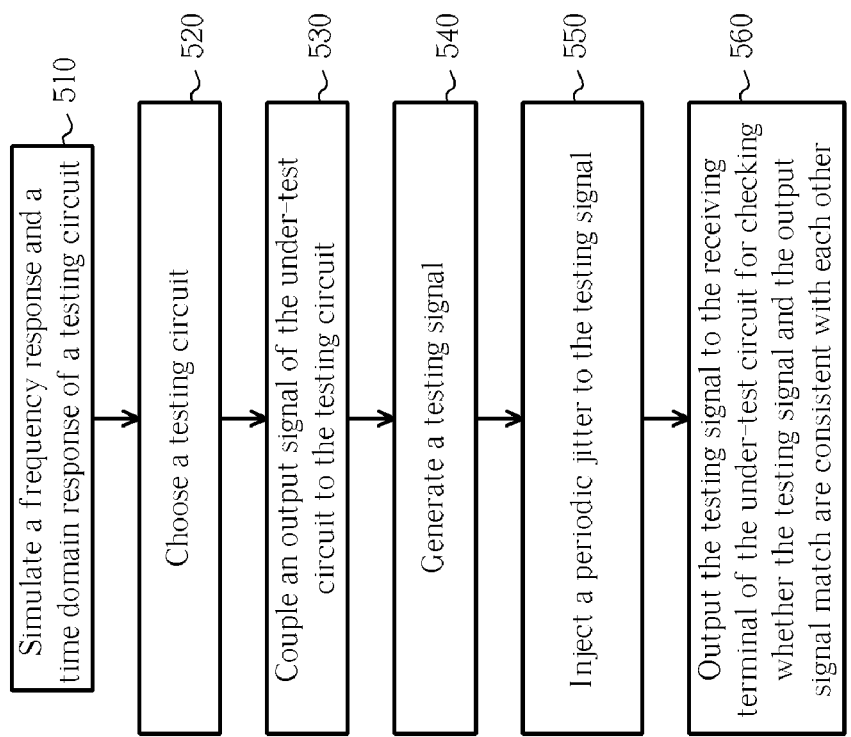
FIG. 5 is a flowchart of a testing method of the present invention.

Please refer to FIG. 5, which is a flowchart of the testing method of the present invention. The testing method comprises:

Step 510: Simulate a frequency response and a time domain response of a testing circuit comprising at least one low-pass filter;

Step 520: Choose a testing circuit, the frequency response and the time domain response simulated by the testing circuit being close to the specifications of an under-test circuit;

Step 530: Couple an output signal of the under-test circuit to the testing circuit;

Step 540: Generate a testing signal generated by the output signal through the testing circuit;

Step 550: Inject a periodic jitter to the testing signal, the periodic jitter being generated by an AC common mode offset circuit receiving a signal of a low-speed testing instrument; and Step 560: Output the testing signal to the input of the under-test circuit for checking whether the testing signal and the output signal match are consistent with each other.

As shown by experiment, the simulations of the testing circuit are consistent with the measured frequency response and the measured time domain response of the transmission channels. The low-pass filter utilized in the present invention is a common low-pass filter and may be fabricated with discrete components. The testing circuit of the present invention may also decay energy by utilizing appropriate transmission circuits and adding embedded components such as vias, inductors, or capacitors for easily injecting a time jitter. A time jitter and a periodic jitter are generated in a testing signal by appropriately adjusting a low-pass filter of the testing circuit, which thus has an appropriate frequency response and an appropriate time domain response, and by adding a periodic signal of a low-speed testing instrument. Therefore, the receiving ability of electronic devices can be tested, and the testing cost and the fabricating cost of the electronic devices during fabrication are significantly decreased to solve the problems of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing method for injecting a time jitter into an under-test circuit comprising the following steps:
   simulating a frequency response and a time domain response in a testing circuit wherein the testing circuit is used for generating a testing signal;
   choosing the testing circuit coupled to the under-test circuit wherein the frequency response and the time domain response of the simulation of the testing circuit approaches a design specification of the under-test circuit;
   receiving an output signal of the under-test circuit;
   generating the testing signal having a time jitter, wherein the testing signal is generated by processing the output signal of the under-test circuit; and
   outputting the testing signal to an input of the under-test circuit.

2. The method of claim 1 further comprising: biasing the testing signal for making the testing signal have a periodic jitter.

3. The method of claim 2 wherein the step of biasing the testing signal for making the testing signal have a periodic jitter is accomplished by injecting a low-speed output signal of a low-speed testing instrument to the testing signal.

4. The method of claim 3 wherein a frequency of the low-speed output signal of the low-speed testing instrument is lower than a frequency of the output signal of the under-test circuit.

5. The method of claim 3 wherein a frequency of the low-speed output signal of the low-speed testing instrument equals the frequency of the periodic jitter of the testing signal.

6. The method of claim 1, wherein simulating the frequency response in a testing circuit is to calculate an insertion loss, a return loss, or an available bandwidth for the under-test circuit.

7. The method of claim 1, wherein simulating the time domain response in the testing circuit is to calculate the time jitter or a signal amplitude gain of the output signal.

8. A testing circuit for injecting time jitter into an under-test circuit comprising:
   an input for receiving an output signal of the under-test circuit from an output of the under-test circuit;
   an output for outputting a testing signal of the testing circuit to an input of the under-test circuit; and
   a first low-pass filter coupled between the input of the testing circuit and the output of the testing circuit for generating the testing signal by processing the output signal of the under-test circuit, wherein the testing signal has a time jitter.

9. The testing circuit of claim 8 wherein the first low-pass filter comprises a first capacitor having a first terminal coupled to the input of the testing circuit.

10. The testing circuit of claim 9 wherein the first capacitor comprises a capacitance for determining an insertion loss of the testing circuit and the time jitter and an amplitude of the output signal.

11. The testing circuit of claim 8 further comprising an alternating current common-mode voltage-bias circuit coupled to the first low-pass filter, wherein the alternating current common-mode voltage-bias circuit receives a low-speed output signal of a low-speed testing instrument for making the testing signal have a periodic jitter.

12. The testing circuit of claim 11 wherein the alternating current common-mode voltage-bias circuit has a voltage dividing circuit for determining an amplitude of the periodic jitter of the testing signal.

13. The testing circuit of claim 12 wherein the alternating current common-mode voltage-bias circuit further comprises a second low-pass filter coupled between the voltage dividing circuit and the low-speed testing instrument.

14. The testing circuit of claim 12 wherein the alternating current common-mode voltage-bias circuit comprises:
   a first resistor having a first terminal coupled between the first low-pass filter and the output of the testing circuit, and having a second terminal coupled to an output of the low-speed testing instrument; and
   a second resistor having a first terminal coupled between the first low-pass filter and the output of the testing circuit, and having a second terminal coupled to ground.

15. The testing circuit of claim 14 wherein the alternating current common-mode voltage-bias circuit further comprises a second capacitor having a first terminal coupled to the second terminal of the first resistor and a second terminal coupled to ground.

16. The testing circuit of claim 8 further comprising:
   a third capacitor having a first terminal coupled to the first low-pass filter and a second terminal coupled to the output of the under-test circuit.

17. The testing circuit of claim 16 wherein the third capacitor is utilized for alternately current coupling the output of the under-test circuit to the input of the testing circuit.

18. The testing circuit of claim 11 wherein a frequency of the low-speed output signal of the low-speed testing instrument is lower than a frequency of the output signal of the under-test circuit.

19. The testing circuit of claim 11 wherein a frequency of the low-speed output signal of the low-speed testing instrument equals a frequency of the periodic jitter of the testing signal.

20. The testing circuit of claim 8 wherein the first low-pass filter has an insertion loss for determining the time jitter and an amplitude of the testing signal.

* * * * *